United States Patent
Urienza

(10) Patent No.: US 8,928,043 B2
(45) Date of Patent: Jan. 6, 2015

(54) HIGH VOLTAGE FET DEVICE WITH VOLTAGE SENSING

(71) Applicant: Monolithic Power Systems, Inc., San Jose, CA (US)

(72) Inventor: Joseph Urienza, Milpitas, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 13/870,786

(22) Filed: Apr. 25, 2013

(65) Prior Publication Data

US 2014/0319608 A1   Oct. 30, 2014

(51) Int. Cl.
*H01L 27/06* (2006.01)
*H01L 29/78* (2006.01)

(52) U.S. Cl.
CPC .................................. *H01L 27/0629* (2013.01)
USPC ........... 257/272; 257/339; 257/360; 257/363; 257/E27.016; 257/E27.024; 257/E29.054; 257/E29.268; 327/537; 438/382; 438/383

(58) Field of Classification Search
USPC .................. 257/272, 339, 369, 363, E27.016, 257/E27.024, E29.054, E29.268; 327/537; 438/382, 383
See application file for complete search history.

(56) References Cited

U.S. PATENT DOCUMENTS

| | | | |
|---|---|---|---|
| 6,680,515 B1 | 1/2004 | Hsing | |
| 2011/0062554 A1* | 3/2011 | Hsing et al. | 257/536 |
| 2011/0068377 A1* | 3/2011 | Hsing et al. | 257/272 |
| 2012/0061726 A1* | 3/2012 | Tokura et al. | 257/141 |
| 2013/0277755 A1* | 10/2013 | Yi | 257/380 |
| 2013/0328619 A1* | 12/2013 | Karino et al. | 327/537 |
| 2014/0070312 A1* | 3/2014 | Yang et al. | 257/337 |

* cited by examiner

*Primary Examiner* — Dao H Nguyen
(74) *Attorney, Agent, or Firm* — Perkins Coie LLP

(57) ABSTRACT

A high voltage FET device provides drain voltage information with less overall silicon area consumption by forming a spiral resistance poly structure over a drift region of the high voltage FET device. The spiral resistance poly structure has an inner most end coupled to a drain region, and an outer most end coupled to a reference ground.

14 Claims, 7 Drawing Sheets

HIGH VOLTAGE FET DEVICE WITH VOLTAGE SENSING

TECHNICAL FIELD

The present invention relates to electronic circuits, and more particularly but not exclusively to high voltage Field Effect Transistor (FET) devices with voltage sensing.

BACKGROUND

At times in electronic circuits containing high voltage circuit, a high voltage node needs to be sensed and divided down so that the low voltage control circuit may execute its function. However, the high voltage may peak to hundreds or thousands of volts while low voltage control circuits are typically in the order of ten volts. However, distorted voltage ratio in the divider resistive network may result due to varying resistances caused by voltage coefficient effect among resistor segments.

One prior art voltage sense method using external discrete resistors. This approach requires an extra pin and its own ESD structure, which consumes substantial silicon area. For low pin count package, this is either not allowed or undesirable. Another prior art voltage sense method is implemented in integrated circuit, which uses diffusion resistors or poly resistors. However, these resistors have to be segmented and each segment resistor must be in its own well tub to minimize voltage coefficient effect, which may distort voltage division ratio.

SUMMARY

In one embodiment, a high voltage FET device with voltage sensing comprises a spiral resistance poly structure formed over the drift region and a plurality of taps formed on the edge of an outer most turn of the spiral resistance poly structure, to provide drain voltage information with less overall silicon area consumption. The spiral resistance poly structure has an inner most end coupled to a drain electrode, and an outer most end coupled to a reference ground. One of the taps is led out to provide a divided down sense voltage indicative of the drain voltage of the high voltage FET device.

The use of the similar reference label in different drawings indicates the same of like components.

DETAILED DESCRIPTION

Embodiments of circuits for high voltage FET device are described in detail herein. In the following description, some specific details, such as example circuits for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

Figure 1:
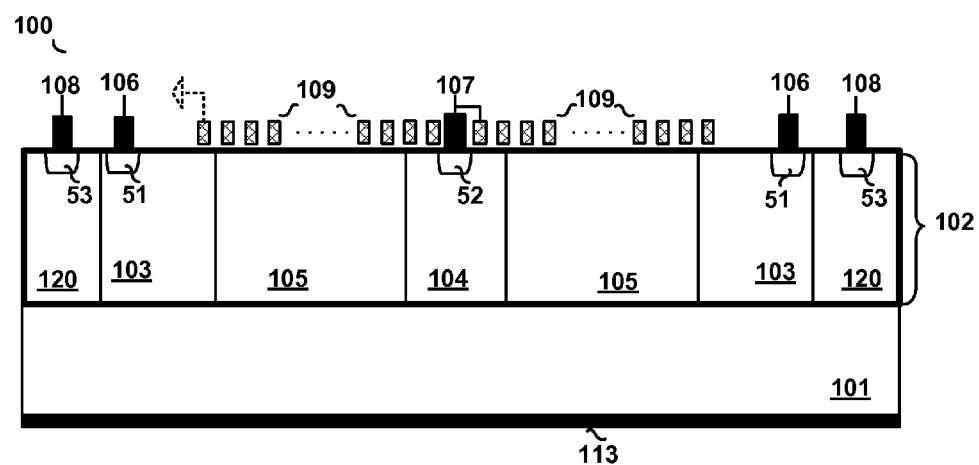
FIG. 1 schematically shows a cross-section view of a high voltage FET device 100 in accordance with an embodiment of the present invention.

FIG. 1 schematically shows a cross-section view of a high voltage FET device 100 in accordance with an embodiment of the present invention. For ease of illustration, FIG. 1 is not drawn to scale, and various doped regions are idealized as rectangles. In the example of FIG. 1, the high voltage FET device 100 comprises: a substrate 101 of a first doping type; an epitaxial layer 102 formed over the substrate 101; a source-channel region 103 of a second doping type formed in the epitaxial layer 102; a drain region 104 of the second doping type formed in the epitaxial layer 102; a drift region 105 of the second doping type formed between the source-channel region 103 and the drain region 104; a connection region 120 of the first doping type formed in the epitaxial layer 102; a connection pickup region 53 of the first doping type formed in the connection region 120; a connection electrode 108 contacted with the connection pickup region 53; a source pickup region 51 of the second doping type formed in the source-channel region 103; a drain pickup region 52 of the second doping type formed in the drain region 104; a source electrode 106 contacted with the source pickup region 51; a drain electrode 107 contacted with the drain pickup region 52; a spiral resistance poly structure 109 formed over the drift region 105, the spiral resistance poly structure 109 having an inner most end coupled to the drain electrode 107, and an outer most end coupled to a reference ground; and a die paddle 113, wherein the entire high voltage FET device structure is attached to the die paddle 113.

In one embodiment, the spiral resistance poly structure 109 is over the drift region 105 and the drain region 104, and it may extend down over the source-channel region 103, as shown in FIG. 1. However, in other embodiments, the spiral resistance poly structure 109 may not extend over the source-channel region 103.

In one embodiment, the high voltage FET device 100 may comprise a Metal Oxide Semiconductor Field Effect Transistor (MOSFET), a Double-diffused MOS (DMOS) or a Junction Field Effect Transistor (JFET). If the high voltage FET device 100 comprises an N type device, the first doping type is P type, and the second doping type is N type; if the high voltage FET device comprises a P type device, the first doping type is N type, and the second doping type is P type.

Figure 2:
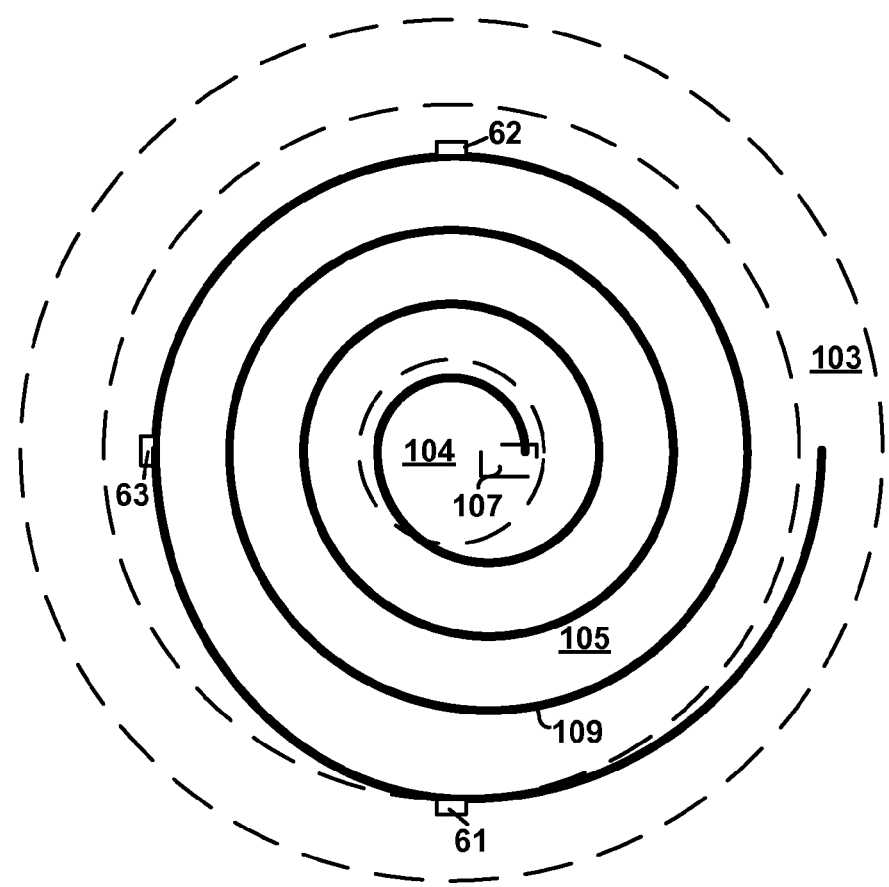
FIG. 2 schematically shows a top plan view of the high voltage FET device 100 in FIG. 1 in accordance with an embodiment of the present invention.

FIG. 2 schematically shows a top plan view of the high voltage FET device 100 in FIG. 1 in accordance with an embodiment of the present invention. For ease of illustration, four turns of the spiral resistance poly structure are shown in FIG. 2, and all turns are shown equal in thickness and widths.

As shown in FIG. 2, the high voltage FET device 100 further comprises a plurality of taps (61~63) formed on the edge of the outer most turn of the spiral resistance poly structure 109. One of the taps is led out to provide a divided down sense voltage which is indicative of the drain voltage of the high voltage FET device to the low voltage circuit (e.g., the control circuit). For ease of illustration, only three taps are shown in FIG. 2. However, the high voltage FET device 100 may have any desired number of taps.

Figure 3:
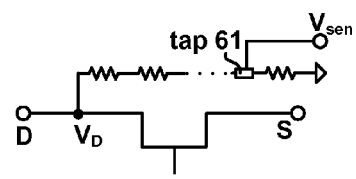
FIG. 3 schematically shows an equivalent circuit of the voltage sense to the high voltage FET device.

FIG. 3 schematically shows an equivalent circuit of the drain voltage sense to the high voltage FET device. In the example of FIG. 3, tap 61 is led out to provide the divided down sense voltage $V_{sen}$ to the low voltage circuit. In a given device, the divided down sense voltage $V_{sen}$ is proportional to the drain voltage of the high voltage FET device, e.g., $$V_{sen} = \frac{X}{100} V_D$$

wherein X is any desired number, and may be dependent on where tap 61 is located in the spiral resistance poly structure 109.

In one embodiment, if the high voltage FET device comprises a JFET, the high voltage FET device may comprise a bottom gate or comprise both a top gate and a bottom gate. In other embodiments, if the high voltage FET device comprises a MOSFET, the high voltage FET device may comprise a poly gate.

Figure 4:
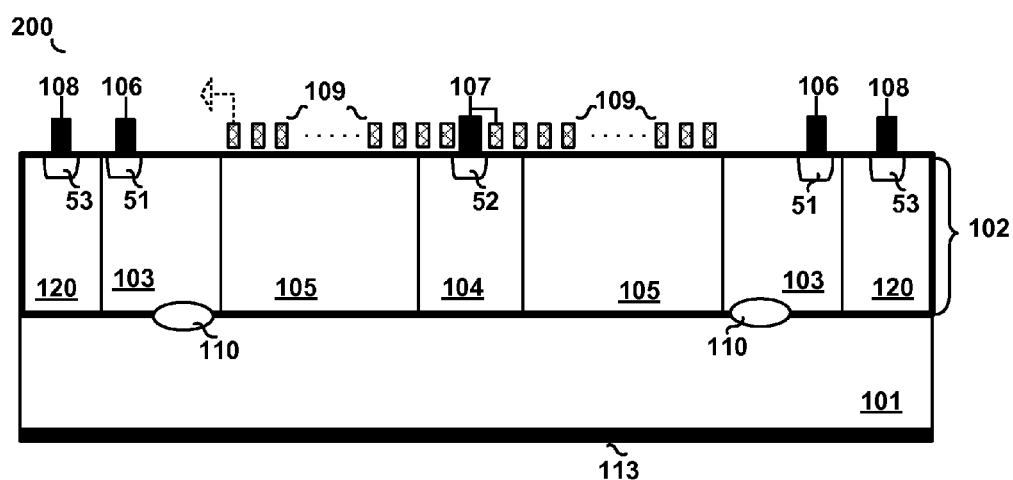
FIG. 4 schematically shows a cross-section view of a high voltage FET device 200 in accordance with an embodiment of the present invention.

FIG. 4 schematically shows a cross-section view of a high voltage FET device 200 in accordance with an embodiment of the present invention. The high voltage FET device 200 in FIG. 4 is similar to the high voltage FET device 100 in FIG. 1, with a difference that the high voltage FET device 200 in FIG. 4 further comprises: a buried layer 110 of the first doping type formed on the substrate 101 and under the source-channel region 103, the buried layer 110 having a higher doping concentration than the substrate 101. The buried layer 110 defines the pinch voltage threshold of the high voltage FET device.

In one embodiment, the source-channel region 103 may have a lower doping concentration than the drain region 104, to get desired pinch voltage of the high voltage FET device.

Figure 5:
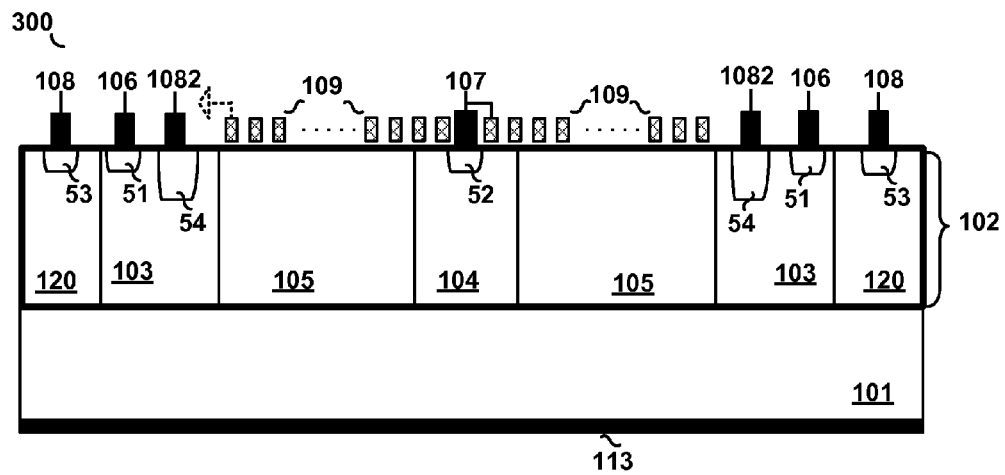
FIG. 5 schematically shows a cross-section view of a high voltage FET device 300 in accordance with an embodiment of the present invention.

FIG. 5 schematically shows a cross-section view of a high voltage FET device 300 in accordance with an embodiment of the present invention. The high voltage FET device 300 in FIG. 5 is similar to the high voltage FET device 100 in FIG. 1, with a difference that the high voltage FET device 300 in FIG. 5 further comprises: a top gate region 54 of the first doping type and with appropriate depth formed in the source-channel region 103; and a top gate electrode 1082 contacted with the top gate region 54.

In one embodiment, the top gate region 54 may further comprise a heavier dose pickup region of first doping type inside itself.

In one embodiment, the top gate region 54 defines the pinch voltage threshold of the high voltage FET device.

Figure 6:
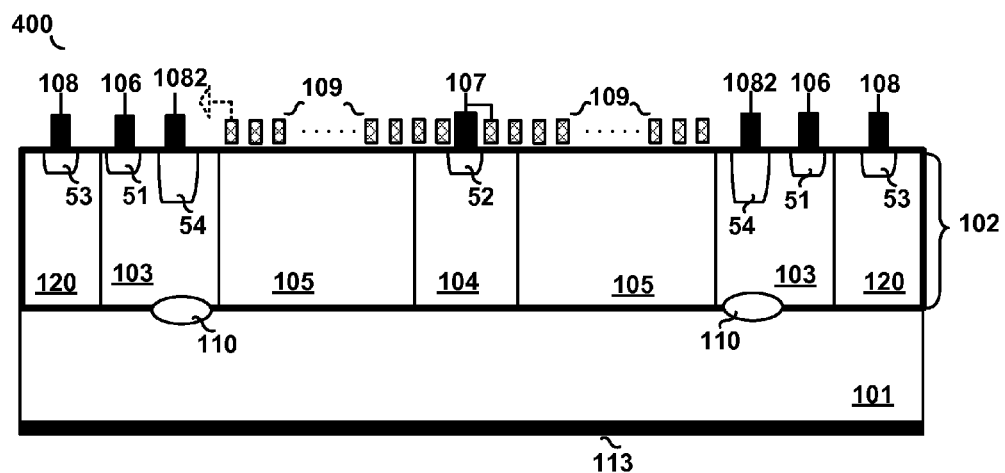
FIG. 6 schematically shows a cross-section view of a high voltage FET device 400 in accordance with an embodiment of the present invention.

FIG. 6 schematically shows a cross-section view of a high voltage FET device 400 in accordance with an embodiment of the present invention. The high voltage FET device 400 in FIG. 6 is similar to the high voltage FET device 300 in FIG. 5, with a difference that the high voltage FET device 400 in FIG. 6 further comprises a buried layer 110 of the first doping type formed on the substrate 101 and under the source-channel region 103, the buried layer 110 having a higher doping concentration than the substrate 101.

In one embodiment, the source-channel region 103 may have a lower doping concentration than the drain region 104, to get desired pinch voltage of the high voltage FET device.

Figure 7:
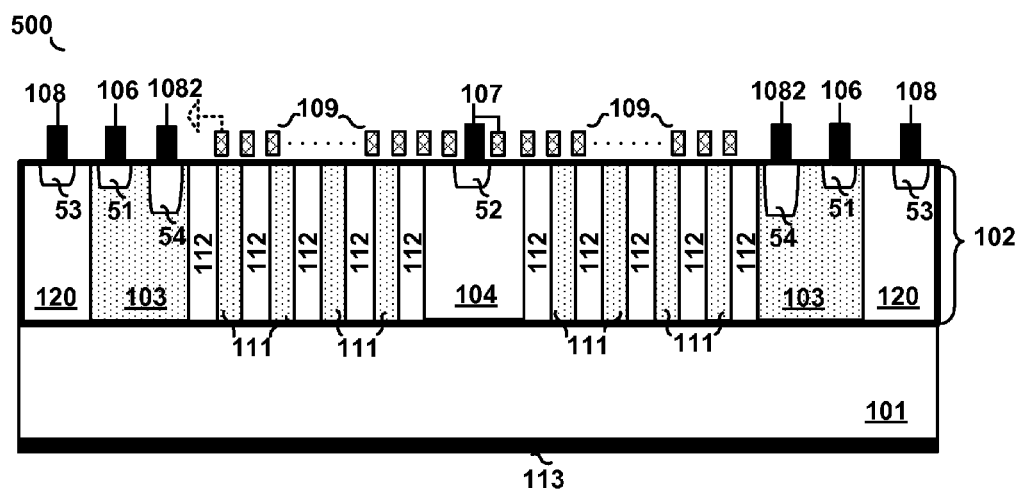
FIG. 7 schematically shows a cross-section view of a high voltage FET device 500 in accordance with an embodiment of the present invention.

FIG. 7 schematically shows a cross-section view of a high voltage FET device 500 in accordance with an embodiment of the present invention. The high voltage FET device 500 in FIG. 7 is similar to the high voltage FET device 300 in FIG. 5, with a difference that the high voltage FET device 500 in FIG. 7 comprises: a plurality of lightly doped regions 111 of the second doping type and a plurality of normally doped regions 112 of the second doping type alternately in turn placed in the drift region 105, the lightly doped regions 111 having a doping level similar to the source-channel region 103, and the normally doped regions 112 having a doping level similar to the drain region 104. With this way, the drift region 105 has a voltage potential incrementally and more uniformly distributed from the source-channel region 103 to the drain region 104.

Figure 8:
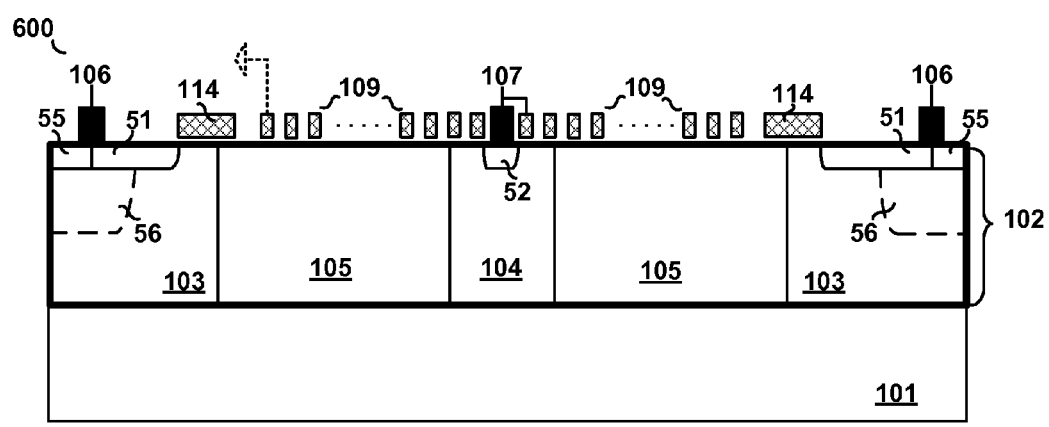
FIG. 8 schematically shows a cross-section view of a high voltage FET device 600 in accordance with an embodiment of the present invention.

FIG. 8 schematically shows a cross-section view of a high voltage FET device 600 in accordance with an embodiment of the present invention. In the example of FIG. 8, the high voltage FET device 600 comprises: a substrate 101 of a first doping type; an epitaxial layer 102 formed over the substrate 101; a body region 103 of the first doping type formed in the epitaxial layer 102; a drain region 104 of a second doping type formed in the epitaxial layer 102; a drift region 105 of the second doping type formed between the body region 103 and the drain region 104; a source pickup region 51 of the second doping type and a body pickup region 55 of the first doping type formed in the body region 103; a drain pickup region 52 of the second doping type formed in the drain region 104; a source electrode 106 contacted with the source pickup region 51 and the body pickup region 55; a drain electrode 107 contacted with the drain pickup region 52; a poly gate 114 formed over part of the body region 103 and over part of the drift region 105; and a spiral resistance poly structure 109 formed over the drift region 105, the spiral resistance poly structure 109 having an inner most end coupled to the drain electrode 107, and an outer most end coupled to a reference ground.

In one embodiment, the high voltage FET device 600 may further comprise a deeper region 56 (as shown in dashed line) of the first doping type formed in the body region 103 and underneath the source pickup region 51.

Figure 9:
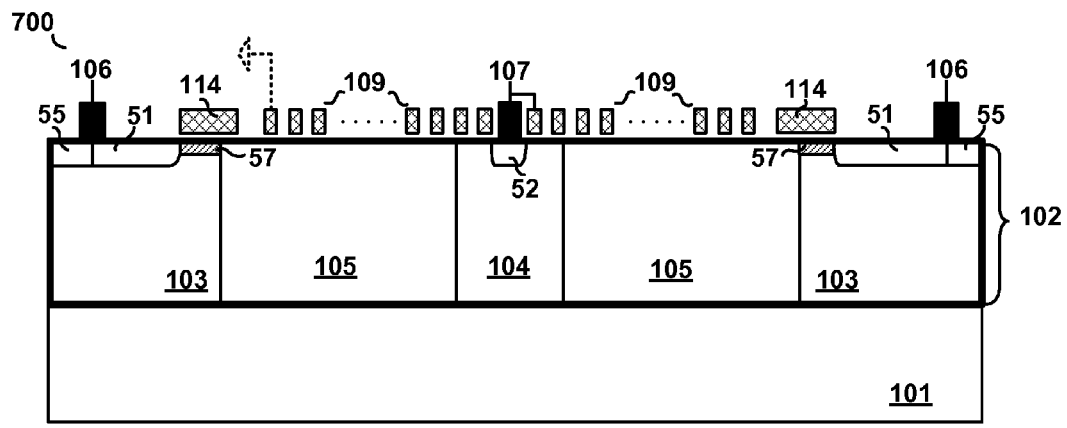
FIG. 9 schematically shows a cross-section view of a high voltage FET device 700 in accordance with an embodiment of the present invention.

FIG. 9 schematically shows a cross-section view of a high voltage FET device 700 in accordance with an embodiment of the present invention. The high voltage FET device 700 in FIG. 9 is similar to the high voltage FET device 600 in FIG. 8, with a difference that the high voltage FET device 700 in FIG. 9 further comprises: a threshold adjust region 57 formed underneath the poly gate 114. The threshold adjust region 57 may also define device type (e.g., depletion or enhancement mode).

In one embodiment, the threshold adjust region 57 may be of first doping type. However, in other embodiments, the threshold adjust region 57 may be of the second doping type.

Figure 10:
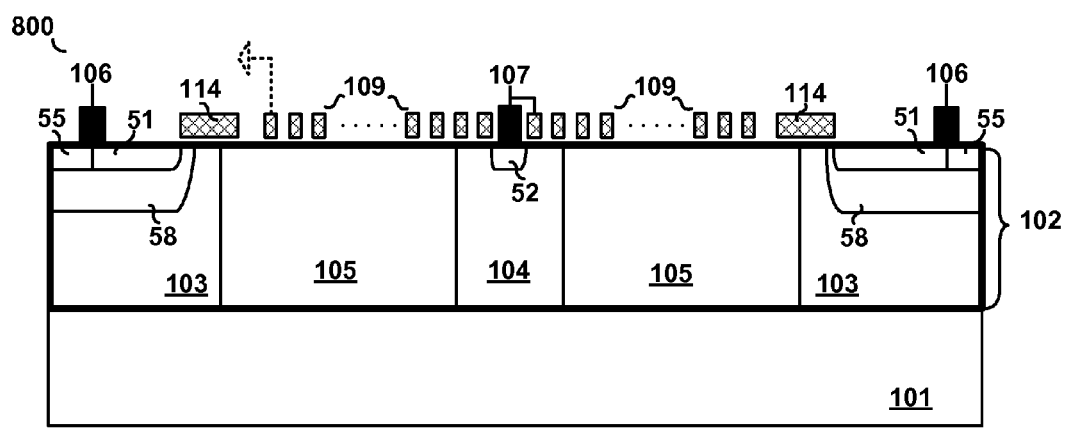
FIG. 10 schematically shows a cross-section view of a high voltage FET device 800 in accordance with an embodiment of the present invention.

FIG. 10 schematically shows a cross-section view of a high voltage FET device 800 in accordance with an embodiment of the present invention. In the example of FIG. 10, the high voltage FET device 800 comprises: a substrate 101 of a first doping type; an epitaxial layer 102 formed over the substrate 101; a drain-drift region 103 of a second doping type formed in the epitaxial layer 102; a drain region 104 of the second doping type formed in the epitaxial layer 102; a drift region 105 of the second doping type formed between the drain-drift region 103 and the drain region 104; a body region 58 of the first doping type formed in the drain-drift region 103; a source pickup region 51 of the second doping type and a body pickup region 55 of the first doping type formed in the body region 58; a drain pickup region 52 of the second doping type formed in the drain region 104; a source electrode 106 contacted with the source pickup region 51 and the body pickup region 55; a drain electrode 107 contacted with the drain pickup region 52; a poly gate 114 formed over part of the body region 58 and over part of the drain-drift region 103; and a spiral resistance poly structure 109 formed over the drift region 105, the spiral resistance poly structure 109 having an inner most end coupled to the drain electrode 107, and an outer most end coupled to a reference ground.

Figure 11:
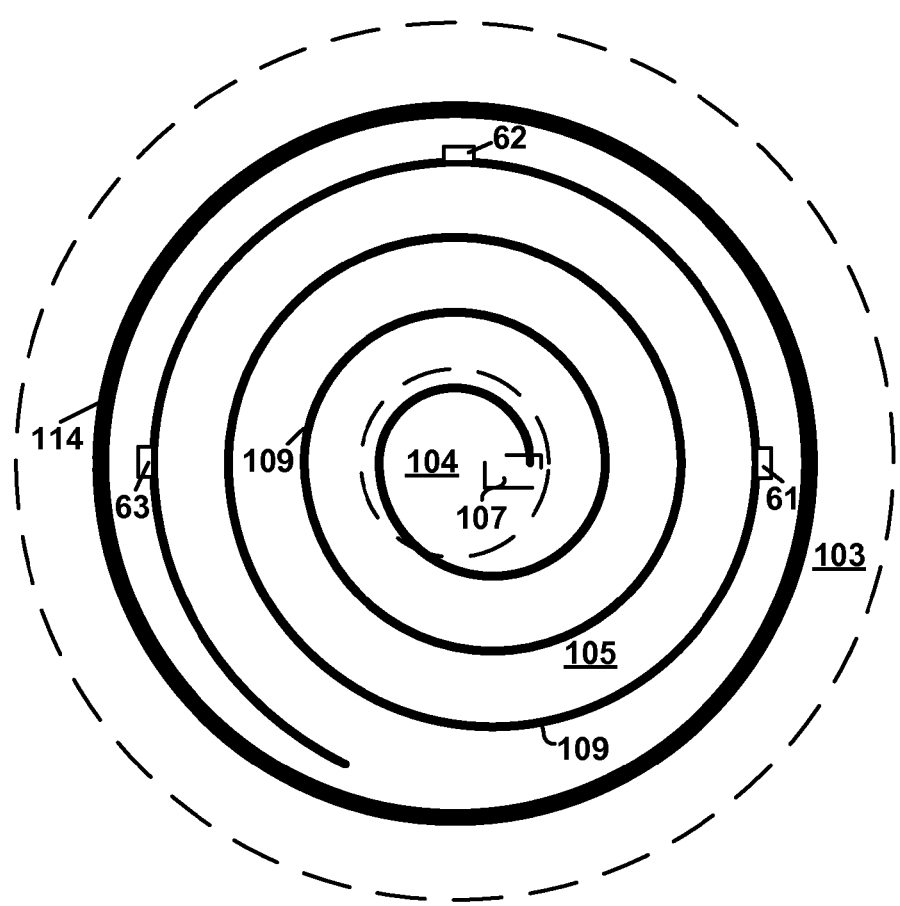
FIG. 11 schematically shows a top plan view of the high voltage FET devices 600, 700 and 800 in FIGS. 8, 9 and 10 in accordance with an embodiment of the present invention.

In one embodiment, the drift region 105 of the high voltage FET devices 600, 700 and 800 may comprise a plurality of lightly doped regions and a plurality of normally doped regions alternately placed in turn, which is similar as the high voltage FET device 500. The lightly doped regions have a doping level lower than the normally doped regions, FIG. 11 schematically shows a top plan view of the high voltage FET devices 600, 700 and 800 in FIGS. 8, 9 and 10 in accordance with an embodiment of the present invention. For ease of illustration, four turns of spiral resistance poly structure 109 are shown in FIG. 11, and all turns are shown equal in thickness and widths. And for ease of illustration, the gate poly 114 is shown with thicker line than the spiral resistance poly structure 109.

As shown in FIG. 11, the high voltage FET devices 600, 700 and 800 further comprise a plurality of taps (61~63) formed on the edge of the outer most turn of the spiral resistance poly structure 109. One of the taps is led out to provide a divided down sense voltage which is indicative of the drain voltage of the high voltage FET device to the low voltage circuit (e.g., the control circuit). For ease of illustration, only three taps are shown in FIG. 11. However, the high voltage FET devices 600, 700 and 800 may have any desired number of taps.

Several embodiments of the foregoing high voltage FET device provide accurate drain voltage information with less overall silicon area consumption compared to conventional technique. Unlike the conventional technique, several embodiments of the foregoing high voltage FET device form a spiral resistance poly structure over the drift region, with an inner most end coupled to the drain region by way of the drain pickup region, and an outer most end coupled to the reference ground. In addition, several embodiments of the foregoing high voltage FET device form a plurality of taps on the edge of the outer most turn of the spiral resistance poly structure, so as to lead any one of the taps out to provide the desired divided down sense voltage which represents the drain voltage information of the high voltage FET device.

It is to be understood in these letters patent that the meaning of "A" is coupled to "B" is that either A and B are connected to each other as described below, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element that in turn is connected to B.

This written description uses examples to disclose the invention, including the best mode, and also to enable a person skilled in the art to make and use the invention. The patentable scope of the invention may include other examples that occur to those skilled in the art.

I claim:

1. A high voltage FET device with voltage sensing, comprising:
   a substrate of a first doping type;
   an epitaxial layer formed over the substrate;
   a source-channel region of a second doping type formed in the epitaxial layer;
   a drain region of the second doping type formed in the epitaxial layer;
   a drift region of the second doping type formed between the source-channel region and the drain region;
   a connection region of the first doping type formed in the epitaxial layer;
   a connection pickup region of the first doping type formed in the connection region;
   a connection electrode contacted with the connection pickup region;
   a source pickup region of the second doping type formed in the source-channel region;
   a drain pickup region of the second doping type formed in the drain region;
   a source electrode contacted with the source pickup region;
   a drain electrode contacted with the drain pickup region;
   a spiral resistance poly structure formed over the drift region, the spiral resistance poly structure having an inner most end coupled to the drain electrode, and an outer most end coupled to a reference ground; and
   a plurality of taps formed on the edge of the outer most turn of the spiral resistance poly structure, wherein one of the taps is led out to provide a divided down sense voltage indicative of the drain voltage of the high voltage FET device.

2. The high voltage FET device of claim 1, further comprising:
   a top gate region of the first doping type formed in the source-channel region; and
   a top gate electrode contacted with the top gate region.

3. The high voltage FET device of claim 1, further comprising:
   a buried layer of the first doping type formed on the substrate and under the source-channel region, the buried layer having a higher doping concentration than the substrate.

4. The high voltage FET device of claim 1, wherein the source-channel region has a lower doping concentration than the drain region.

5. The high voltage FET device of claim 1, further comprising:
   a plurality of lightly doped regions of the second doping type and a plurality of normally doped regions of the second doping type alternately in turn placed in the drift region, the lightly doped regions having a doping level similar to the source-channel region, and the normally doped regions having a doping level similar to the drain region.

6. The high voltage FET device of claim 1, further comprising:
   a die paddle, wherein the entire high voltage FET device structure is attached to the die paddle.

7. A high voltage FET device with voltage sensing, comprising:
   a substrate of a first doping type;
   an epitaxial layer formed over the substrate;
   a body region of the first doping type formed in the epitaxial layer;
   a drain region of a second doping type formed in the epitaxial layer;
   a drift region of the second doping type formed between the body region and the drain region;
   a source pickup region of the second doping type and a body pickup region of the first doping type formed in the body region;
   a drain pickup region of the second doping type formed in the drain region;
   a source electrode contacted with the source pickup region and the body pickup region;
   a drain electrode contacted with the drain pickup region;
   a poly gate formed over part of the body region and over part of the drift region; and
   a spiral resistance poly structure formed over the drift region, the spiral resistance poly structure having an inner most end coupled to the drain electrode, and an outer most end coupled to a reference ground.

8. The high voltage FET device of claim 7, further comprising:
   a deeper region of the first doping type formed in the body region and underneath the source-channel region.

9. The high voltage FET device of claim 7, further comprising:
   a threshold adjust region formed underneath the poly gate.

10. The high voltage FET device of claim 7, further comprising:
    a plurality of taps formed on the edge of the outer most turn of the spiral resistance poly structure, wherein one of the taps is led out to provide a divided down sense voltage indicative of the drain voltage of the high voltage FET device.

11. The high voltage FET device of claim 7, wherein the drift region comprises a plurality of lightly doped regions and a plurality of normally doped regions alternately placed in turn, the lightly doped regions having a doping level lower than the normally doped regions.

12. A high voltage FET device with voltage sensing, comprising:
    a substrate of a first doping type;
    an epitaxial layer formed over the substrate;
    a drain-drift region of a second doping type formed in the epitaxial layer;
    a drain region of the second doping type formed in the epitaxial layer;
    a drift region of the second doping type formed between the drain-drift region and the drain region;
    a body region of the first doping type formed in the drain-drift region;
    a source pickup region of the second doping type and a body pickup region of the first doping type formed in the body region;
    a drain pickup region of the second doping type formed in the drain region;
    a source electrode contacted with the source pickup region and the body pickup region;
    a drain electrode contacted with the drain pickup region;
    a poly gate formed over part of the body region and over part of the drain-drift region; and
    a spiral resistance poly structure formed over the drift region, the spiral resistance poly structure having an inner most end coupled to the drain electrode, and an outer most end coupled to a reference ground.

13. The high voltage FET device of claim 12, further comprising:
    a plurality of taps formed on the edge of the outer most turn of the spiral resistance poly structure, wherein one of the taps is led out to provide a divided down sense voltage indicative of the drain voltage of the high voltage FET device.

14. The high voltage FET device of claim 12, wherein the drift region comprises a plurality of lightly doped regions and a plurality of normally doped regions alternately placed in turn, the lightly doped regions having a doping level lower than the normally doped regions.

* * * * *